United States Patent [19]

Demeyer et al.

[11] Patent Number: 5,089,974
[45] Date of Patent: Feb. 18, 1992

[54] BUILDING TECHNICAL MANAGEMENT CONTROLLER WITH A TWO-WIRE DATA AND POWER TRANSMISSION LINE

[75] Inventors: Pierre Demeyer, Uriage; Jean-Luc Mertz, Grenoble; Corinne Segond, Grenoble; Serge Moutet, Grenoble; Robert Chevaleyre, Seyssinet Pariset; Henri Lhuillier, Seyssins; Patrick Barthelemy, St. Egreve, all of France

[73] Assignee: Merlin Gerin, France

[21] Appl. No.: 430,411

[22] Filed: Nov. 2, 1989

[30] Foreign Application Priority Data

Nov. 4, 1988 [FR] France ................. 88 15053
Nov. 4, 1988 [FR] France ................. 88 15054
Nov. 4, 1988 [FR] France ................. 88 15058

[51] Int. Cl.⁵ .................... G06F 15/20; G05B 23/02
[52] U.S. Cl. ........................ 364/492; 340/310 R; 340/825.07; 364/550
[58] Field of Search ......... 364/131, 132, 133, 492, 364/550; 340/310 A, 310 R, 288, 295, 425, 540, 825.06, 825.07, 825.32, 825.39

[56] References Cited

U.S. PATENT DOCUMENTS

| | | | |
|---|---|---|---|
| 3,675,205 | 7/1972 | Mereen et al. | 340/825.04 |
| 4,418,333 | 11/1983 | Schwarzbach et al. | 340/310 A |
| 4,535,401 | 8/1985 | Penn | 340/310 R |
| 4,540,890 | 9/1985 | Gangemi et al. | 340/310 R |
| 4,573,041 | 2/1986 | Kitagawa et al. | 340/310 A |
| 4,644,320 | 2/1987 | Carr et al. | 340/310 A |
| 4,679,045 | 7/1987 | Sadamori et al. | 340/825.07 |
| 4,682,648 | 7/1987 | Fried | 340/310 A |
| 4,703,306 | 10/1987 | Barritt | 340/310 A |
| 4,755,792 | 7/1988 | Pezzolo et al. | 340/310 R |
| 4,806,905 | 2/1989 | McGowan, III et al. | 340/310 R |
| 4,829,560 | 5/1989 | Evanyk et al. | 340/825.07 |
| 4,847,781 | 7/1989 | Brown, III et al. | 340/310 A |
| 4,888,495 | 12/1989 | Feron et al. | 340/310 A |

FOREIGN PATENT DOCUMENTS

| | | |
|---|---|---|
| 0068482 | 1/1983 | European Pat. Off. |
| 0163921 | 12/1985 | European Pat. Off. |
| 3329049 | 3/1984 | Fed. Rep. of Germany |
| 2558609 | 7/1985 | France |
| 8702795 | 5/1987 | PCT Int'l Appl. |
| 2008362 | 5/1979 | United Kingdom |
| 2123589 | 2/1984 | United Kingdom |

OTHER PUBLICATIONS

Heathkit, Spring 1987 Catalog; "Let the Smarthome I Controller take care of you and your home", pp. 22-23.
Patent Abstract of Japan, vol. 7, No. 94 (E-171) [1239], JP-A-58 19 064.
1985 IEEE International Conference on Consumer Electronics, Lasalle, Jun. 5, 1985, pp. 30-31, D. I. Hariton et al., "AC Power Line Modem for Consumer and Industrial Environments."

Primary Examiner—Kevin J. Teska
Attorney, Agent, or Firm—Parkhurst, Wendel & Rossi

[57] ABSTRACT

A building power management controller comprises a plurality of modules connected by a two-wire network. Each module comprises a data transceiver device, controlled by a microprocessor to both transmit data to the other modules and to a central unit via the two-wire network, and to receive information via this two-wire network. The modules are supplied with power by the two-wire network. When two modules transmit simultaneously, one takes priority so as not to disturb the messages transmitted.

9 Claims, 7 Drawing Sheets

BUILDING TECHNICAL MANAGEMENT CONTROLLER WITH A TWO-WIRE DATA AND POWER TRANSMISSION LINE

BACKGROUND OF THE INVENTION

The invention relates to a building technical management controller having several data receipt and transmission modules located throughout the building, in particular sensor and/or actuator modules and a central unit module, interconnected by a symmetrical two-wire network for binary data transmission in asynchronous mode.

The technical equipment of buildings is becoming more and more complex and management of certain functions, such as heating or lighting, is often automated. State-of-the-art controllers are designed for a particular application or installation and it is difficult to adapt or extend them. They require multiple electrical connections, which are often the cause of incidents.

It has already been proposed to use standard programmable controllers for building management, but these elaborate, expensive systems are only justified in the tertiary sector and in certain special cases.

The need arises for a building management system which is easy to install, even in existing buildings, and which can perform all the automatic controls with great flexibility of adaptation, without implementing complicated, costly devices and multiple hard-wired connections.

SUMMARY OF THE INVENTION

The controller according to the present invention meets this requirement and is characterized in that, each module comprises a data transmitter and receiver. A power supply unit is connected to said two-wire network to supply power to said modules connected to the network. The power supply unit includes a voltage generator limited in current. The binary data transmitted via the network is modulated at two electrical voltage levels between the two wires of the network, the low voltage level corresponding to short-circuiting of the network by one of the transmitting modules, and the high level corresponding to a break status of the asynchronous transmission standard, enabling the modules to be supplied with power.

The sensors and controller devices, which are located at different points of the building, are connected only by a two-wire network or line which performs both data transmission and module power supply. Each module is assigned an address for receipt and sending of messages. A temperature sensor module is for example arranged to indicate that a preset temperature threshold is exceeded, whereas a lighting remote control module receives orders to switch the lamps on or off. Each module continuously monitors the signals or bits transmitted by the two-wire network or bus, and selects the messages that concern it. The two-wire connection is easy to achieve even in old buildings, and when the electrical power supply to the modules is, according to the invention, provided by the same two-wire network, installation of the controller does not give rise to any problems.

The break state is the most frequent normal state of the network and the transmission standard is chosen to present in the break state a current level enabling the modules to be supplied with power. This power supply is interrupted during the moments when the network is short-circuited and to maintain the power supply to the electronic circuitry of the modules, the latter have a power reserve available, for example supplied by a capacitor.

The controller power supply is incorporated in the central management unit or control panel, but separation of the two functions is possible in certain particular applications. This power supply is a voltage generator limited in current, for example to twice the total consumption of the modules to bring about an appropriate voltage drop when a network short-circuit occurs. The supply voltage is for example 15 Volts with short-circuit current limitation to 300 mA. The network is arranged in such a way as to obtain when short-circuiting occurs at any point a voltage drop at all points at the most equal to a quarter of the supply voltage. Generally the length of the network is sufficiently small and this constraint hardly causes any problems.

According to a development of the invention, the power consumption is reduced by the use of low-consumption components and by a module standby state during the break periods. This standby state is interrupted by receipt of a signal, for example a message start signal, and cyclically to execute the tasks assigned to the modules, notably sending of messages. The output orders are advantageously made by means of pulses and the sensors are in a consumption state only during the read periods. These arrangements, which are not necessarily all used in combination, contribute to reducing the controller power consumption enabling a simplified network structure.

The invention is applicable to a network whose modules or some of whose modules have a local power supply and are therefore not supplied by the two-wire network. The module transmission function remains supplied by the two-wire network, but the other functions, for example measurement, are supplied independently with galvanic separation, notably opto-electronic, from the two-wire network.

Modulation is achieved by pinching, i.e. shorting, the power line constituted by the two-wire network, advantageously in accordance with the asynchronous transmission standard at standardized speed. This standard is chosen for its universal nature and its break state corresponds to the module power supply level. Its interfacing is reduced.

Each module can only switch to transmission when the line is free, which involves permanent listening and transmission disabling if another module is already sending a message. When two modules start a message at the same time, one of them must withdraw and according to the invention it is the module which first sends a low bit or 0 corresponding to short-circuiting of the line whereas the other one sends a high bit or 1, that is given priority. The priority is thus established on the first byte of the message. When it transmits or at least when it starts transmitting, the module monitors the state of the line when it sends a 1. If at that time it sees that the line is forced to 0 by a short-circuiting, this means that another transmitter has started transmitting at the same time as it did, and it withdraws so as not to disturb the message from the transmitter which sent the 0. The transmitter which withdrew continues listening to the line so as to know when it becomes free again and to transmit its message at this time. The message which took priority is not disturbed by the other message and it is not necessary to repeat it, even if it is intended for the module which started transmitting at the same time.

The controller modules are standard and are individualized when they are associated with a sensor or actuator by special programming. These programs can be more or less standard, the same program being able to be used for all the temperature sensors or break-in detectors of the building. The central unit or control panel enables the whole system to be supervised and monitored and notably comprises display, indication, programming and/or remote control devices.

One of the essential conditions of the automatic control circuits and of their correct operation is indication of any failure, preferably before this failure can affect correct operation of the installation. To enable a break in the two-wire line to be detected while preserving continuity of service, according to a development of the invention, the line is loop connected by means of the central unit which comprises output terminals and input terminals of said line. In normal operation, the line output and input are parallel connected by means of a switch and, when a break detection operation takes place, the input is disconnected from the output and connected to a receiver and the signals received on the input and the signals present on the line output are compared to detect any difference.

By loop-connecting the line on the central unit controlling operation of the controller, the signals are sent by the two ends on the line and an interruption of the latter at any point does not affect the messages being conveyed along the two-wire line. Continuity of service is thereby ensured, but a second failure may occur, notably a second interruption of the line, which would of course isolate the modules located between the two breaks. By periodically running a break detection procedure, a break is indicated generally before a second break occurs, enabling repairs to be performed before controller failure occurs.

The two-wire line is loop connected on the central unit and the line output and input are normally parallel connected by means of a switch, advantageously of the electronic type, which enables signals to be sent by the two ends of the line. At regular intervals, the central unit opens the switch connecting the two ends of the line, and sends a checking signal to the output terminals of the line. In the case of continuity of the two-wire line, this signal appears on the input terminals of the central unit and is transmitted by means of a receiver and an opto-electronic connection to the comparator. This comparator checks the identity of the signals sent on the line output and of the signals received on the line input and in the event of signals not being received on the input when a signal is sent on the output indicates the failure generally constituted by interruption of one of the wires of the line. This checking procedure is run in the normal operating cycle of the controller which is not disturbed. The message or checking signals can have an appropriate formatting, but performing the checking operation when a standard message is transmitted by the central unit would not depart from the scope of the invention.

According to a development of the invention, detection or location of the line break can be facilitated by successive questioning of the different modules, and by listening to the replies from the latter. A non-reply from one of the modules confirms non-receipt of the message due to a break in the line upstream from this module.

The break detection device makes use of the usual constituents of the modules, notably of the central unit in which it suffices to incorporate a switch device and an additional receiver. These modifications are particularly simple and provide amply sufficient operating safety for this type of controller.

The modules can be constituted by control devices designed to control, via the data transmission network, other modules constituting associated, remote-located actuators, a single actuator being able to be associated with a plurality of control devices.

According to a development of the invention, a control device comprises actuator status indication means, controlled by the control device microprocessor which monitors the messages transmitted over the network and determines the actuator status from these messages. These means are preferably constituted by light-emitting diodes.

The actuator status is thus indicated on each of the control devices associated with it, wherever the control order comes from.

According to a development of the invention, the microprocessor comprises an input and an output connected to an interface, itself connected to the transmission network, a control input receiving control or measurement signals and at least one control output of the actuator status indication means.

In a particular embodiment, the control device is formed by a push-button module and the microprocessor control input is connected to a voltage source by means of a push-button, pressing the push-button causing a control message to be sent by the microprocessor to the associated actuator. In a push-button module of this kind, a 3-position selector switch can be provided whose coded outputs are connected to the microprocessor, pressing the push-button resulting in an On order of the associated actuator in a first position of the selector switch, in an Off order in the second position, and in a status change order in the third position.

According to another particular embodiment, the control device is formed by a measurement module and the microprocessor control input is connected to a measurement sensor, the microprocessor comparing the measurement sensor output signals with preset thresholds and sending actuator control orders according to the relative values of the measurement signals and thresholds.

BRIEF DESCRIPTION OF THE DRAWINGS

Other advantages and features will become more clearly apparent from the following description of several illustrative embodiments of the invention, given as non-restrictive examples only and represented in the accompanying drawings, in which.

DESCRIPTION OF THE PREFERRED EMBODIMENT

Figure 1:
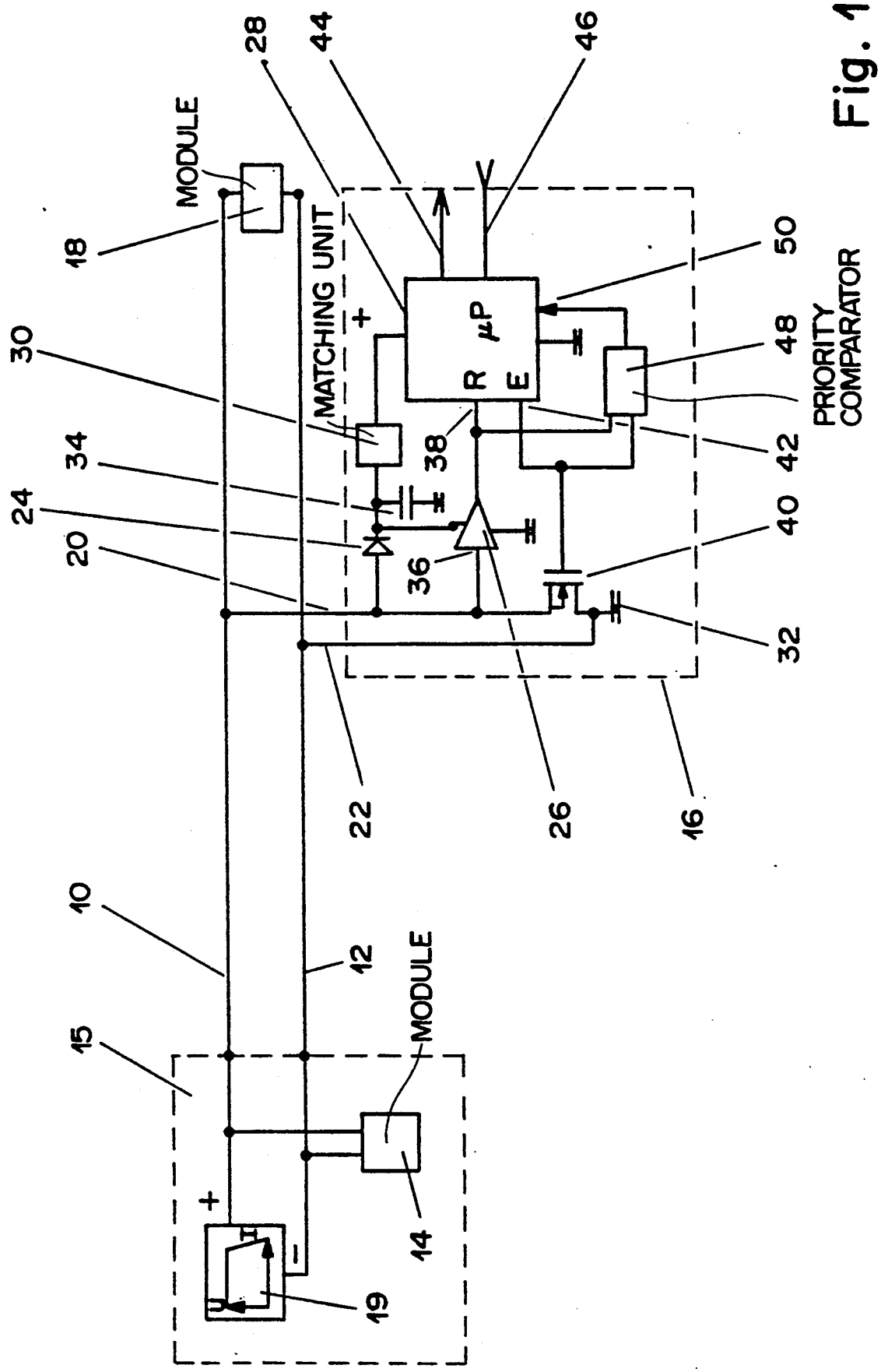
FIG. 1 is a block diagram of a technical management controller according to the invention.

In FIG. 1, a building technical management controller comprises a data transmission network with two wires 10, 12 interconnecting various modules 14, 16, 18. In the embodiment of FIG. 1, module 14 is coupled with a power supply 19 to form a central module unit 15. The designation of module 19 as the central module is arbitrary. The modules 14 to 18, which may of course be of any number, are located at different points in the building and are for example constituted by temperature sensors controlling heating of the building, actuators or contactors controlling motors, for example for opening and closing shutters or doors, presence or break-in detectors, etc. . . . The central unit 15 comprises a power supply unit 19 supplying the different modules 14, 16, 18 via the conductors 10, 12. The power supply unit is constituted by a voltage generator supplying a preset DC voltage U, for example 15 Volts, and is limited in current so as to limit the short-circuit current in the network 10, 12 to a value close to twice the total supply current of the modules 14, 16, 18. This short-circuit current is for example close to 300 milliamps, but depending on the characteristics of the controller it may be notably higher or lower. Current limiting of the power supply unit 19 is achieved by any suitable means.

Figure 6:
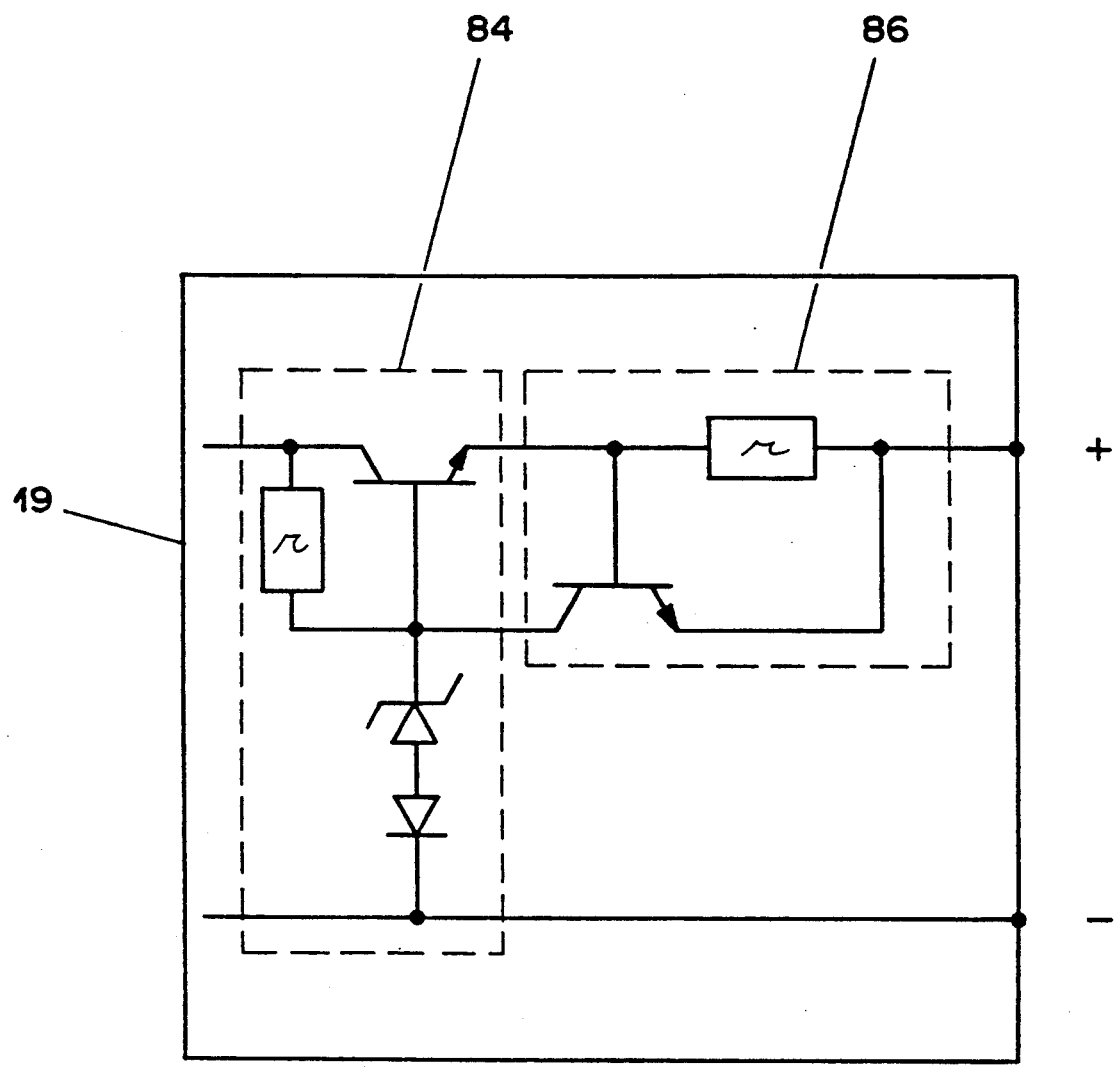
FIG. 6 represents a particular embodiment of the power supply unit of the controller according to FIG. 1.

A particular embodiment of the power supply unit 19 is represented in FIG. 6. The unit 19 comprises a voltage regulator 84 supplied by any suitable means, in a state-of-the-art manner, and a current limiter 86 connected downstream from the voltage regulator 84 and designed to limit the short-circuit current to a preset value. The power supply unit therefore behaves as a voltage generator supplying the network with a fixed DC voltage U so long as the current does not exceed a certain value, for example 250 mA. When the network is short-circuited, the regulated voltage drops suddenly, but the current limiter 86 operates to limit the current, the assembly then behaving as a current generator.

The modules 14, 16, 18 are all identical, and only one of them 16 is described hereafter in detail. The module 16 is connected by a connection 20 to the conductor 10 and by a connection 22 to the conductor 12. The connection 20 supplies, via a diode 24, both an amplifier 26 and a microprocessor 28 via a matching unit 30. The connection 22 is grounded at 32 and a power storage capacitor 34 is connected to the output of the diode 24 and to the ground. The connection 20 is in addition connected to the input 36 of the amplifier 26 operating as a receiver, the output of which is connected to a port 38 of the microprocessor 28. A switch 40, for example a semi-conductor connected to a port 42 of the microprocessor 28, connects in the closed position the connections 20 and 22 short-circuiting the conductors 10 and 12. The microprocessor 28 comprises one or more outputs 44, and one or more inputs 46 respectively for control of actuators such as remote-controlled switches, and for receipt of measurement signals, for example delivered by sensors. The ports 38 and 42 of the microprocessor 28 are connected to a comparator unit 48 which compares at each instant the signals present on these two ports and sends a collision signal to an input port 50 of the microprocessor 28. Each module 16 is capable of sending signals by closing of the switch 40 and short-circuiting of the conductors 10, 12, causing shorting of the line formed by these two conductors and a drop in the voltage to a low level. Modulation is achieved according to the asynchronous transmission standard at standardized speed, the break status of which corresponds to the high supply level of the modules 14, 16, 18. The capacitor 34 is capable of supplying the module during the time the line 10, 12 is forced to 0 by one of the modules 14, 16, 18.

The controller operates as follows:

In the break position, switch 40 open, the power supply unit 19 maintains the line 10, 12 at a high voltage level, for example 15 Volts corresponding to a 1 bit of the digital signals transmitted by the line or network 10, 12. The modules 14, 16, 18 are supplied by this line 10, 12 and the capacitors 34 are charged. Transmission of a message, for example by the module 16, is controlled by its microprocessor 28 which causes the switch 40 to close to short the line 10, 12 and force it to a voltage close to 0 Volts, corresponding to a 0 bit. Each message transmitted via the line 10, 12 comprises an address corresponding to the module 14, 16, 18 involved, and each module permanently listens to the messages transmitted via the line 10, 12. When the microprocessor 28 recognizes the address associated with its module, it performs the operations corresponding to the message received. These operations are transmitted by the outputs 44 to the actuators or the sensors controlled by the module. The central unit module 15 or control panel can supervise operation of the controller and enable centralized remote control with display or receipt of the messages from the various modules. To this end, the central unit 15 is equipped with a transceiver similar to that of the modules 14, 16, 18.

Figure 3:
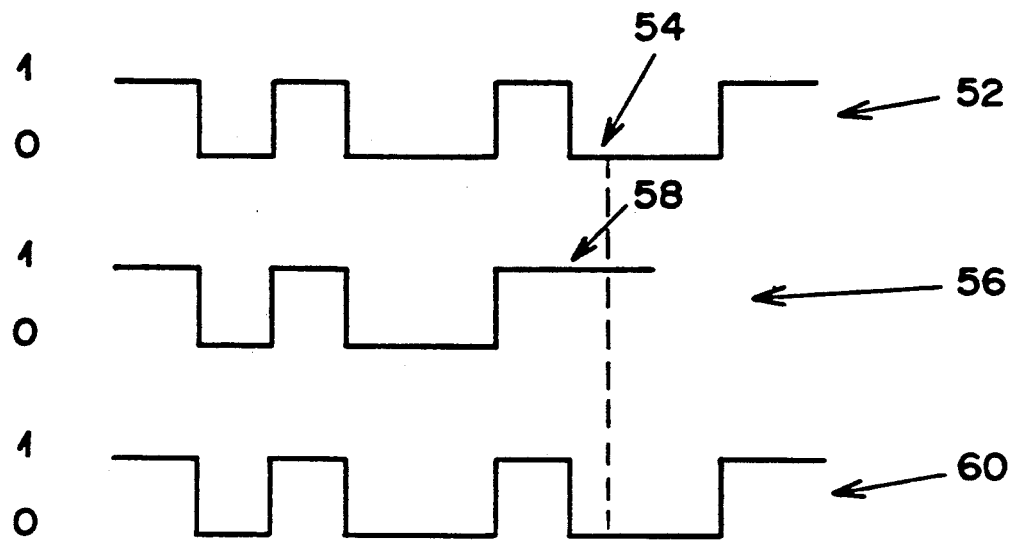
FIG. 3 illustrates the messages sent simultaneously by two different modules.
Figure 2:
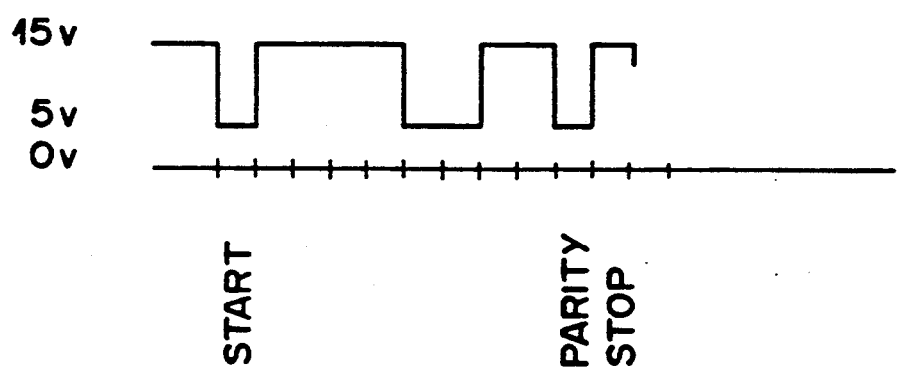
FIG. 2 illustrates a message byte of the controller according to FIG. 1.

Each module 14, 16, 18 monitors the line continuously, and only sends a message if the line 10, 12 is free. A low bit or 0 corresponding to a short-circuit of the line 10, 12 has priority over a high bit or 1 corresponding to the modules power supply level. By preventing simultaneous transmission by several modules connected by the line 10, 12, degradation of the messages is avoided. When two transmitters ascertain that the line 10, 12 is free and decide to transmit at the same time, the collision of the two messages disturbs transmission. The transmission protocol in this case gives priority to one of the messages, this priority being given to the message which sends the first 0 on the line, whereas the other one sends a 1. This means that a module which is transmitting must continuously monitor the status of the line, notably when it sends a 1. If at that moment it sees that the line 10, 12 is forced to the status 0, this is because another transmitter has started at the same time as it did. The one which sends a 1 first in this case withdraws, so as not to disturb the message from the module which is simultaneously transmitting a 0. The module which withdrew continues to listen to the line and when the latter is free, it sends its message. Referring to FIG. 3, it can be seen that the message 52 sent by one of the modules sends a zero signal 54 first, whereas the message 56 sent by another module sends a high signal 58 at the same time. As the latter module first sent a 1 signal, it stops transmitting and the message transmitted 60 corresponds to that illustrated in 52. The priority signal 52 is not disturbed by this collision and it is unnecessary to repeat it. The collision is detected by the comparator 48 which receives on its inputs the signals received on the port 38, and the signals sent by the port 42 of the microprocessor 28. When the comparator 48 detects a difference between the signals received and the signals sent, it transmits a collision signal to the port 50, and the microprocessor determines the priority, and if necessary, decides whether to continue transmission or to interrupt it.

Figure 4:
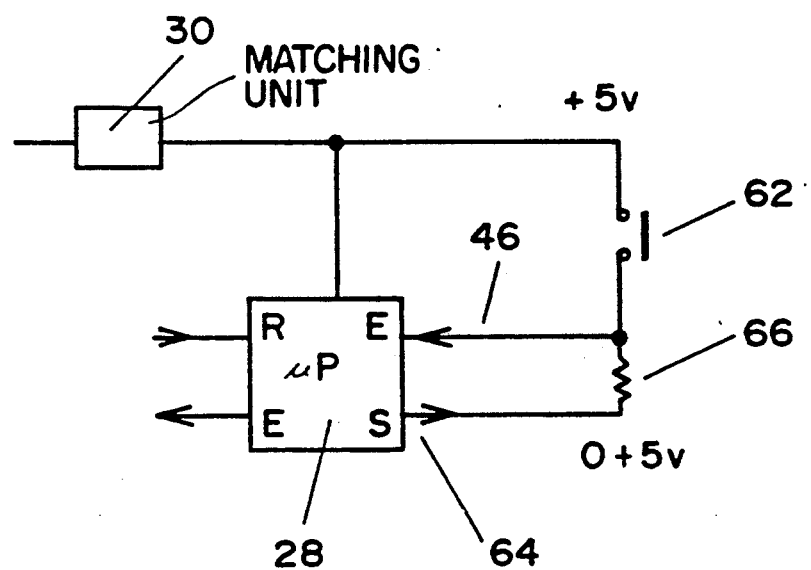
FIG. 4 is a partial view of FIG. 1, showing the power supply of a sensor.

The sensors or actuators schematically represented by a contact 62 in FIG. 4 can be supplied by the transmission line 10, 12, in which case it is advantageous to reduce their power consumption in order not to oversize the transmission network. The contact 62 is connected on the one hand to the matching unit 30, and on the other hand via a resistor 66 to an output 64 of the microprocessor 28. The input 46 of the microprocessor is connected to the connection point between the resistor 66 and the contact 62. In the open position of the contact 62, the input 46 receives a zero signal, whereas closing of the contact 62 switches the input to a higher potential. Normally the output gate 64 is at high potential, for example +5 Volts, and closing or opening of the contact 62 does not cause any current to flow, and the power consumption of the sensor is therefore nil. When the microprocessor decides to read the sensor 62, it switches the potential of the output 64 to level 0, causing a current to flow through the resistor 66, when the contact 62 is closed. This power consumption only occurs during the read time, the microprocessor switching the output 64 back to the high potential as soon as it has recorded the signal received on the input 46. The power consumption is thus notably reduced.

Figure 5:
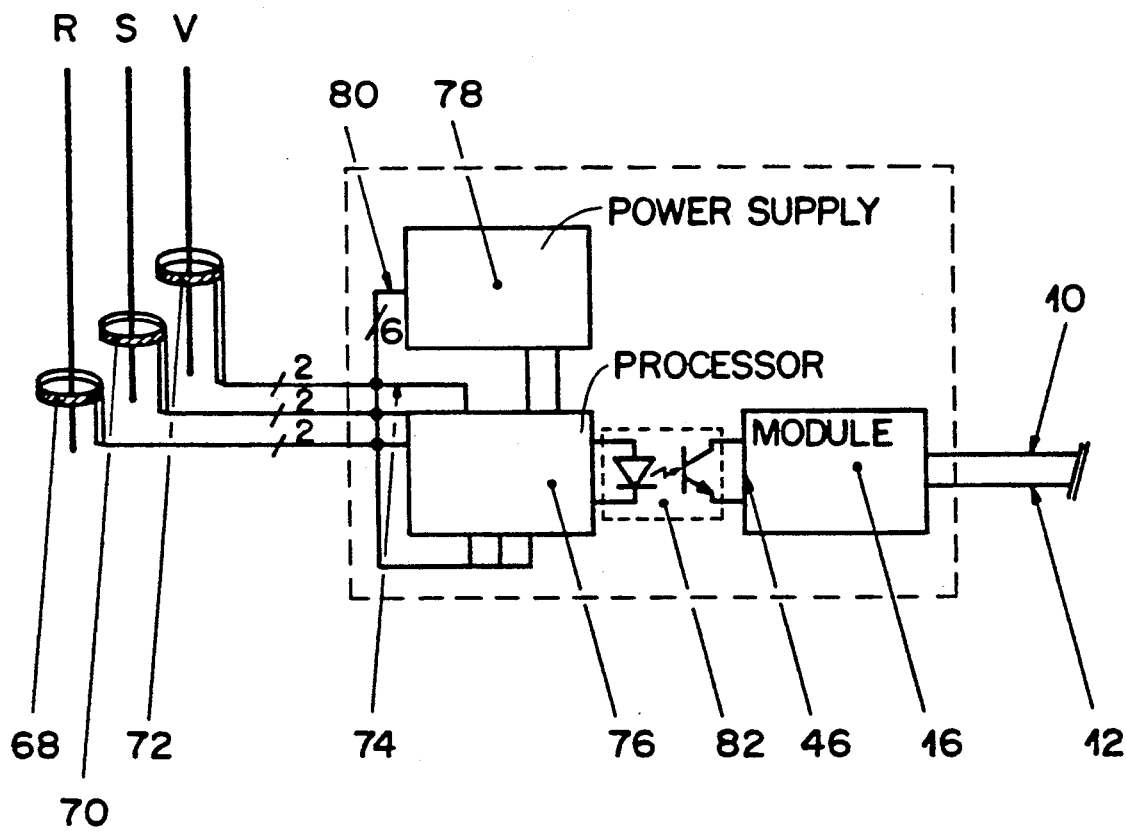
FIG. 5 is a block diagram of a system-powered sensor of a controller according to FIG. 1.

The sensors or actuators can naturally include their own power supply source, for example an auxiliary source, and this solution is suitable for sensors or actuators operating in conjunction with the electrical mains supply system. The actuator may be a contactor controlling a motor whose electromagnet is supplied by the mains system while being controlled by the power management controller. FIG. 5 represents a sensor with an auxiliary power supply source, more particularly a current measuring device of a three-phase mains system R,S,V. A toroid-shaped current transformer 68, 70, 72 is associated with each phase R,S,V to deliver a signal proportional to the current flowing in the corresponding phase conductor. The signals delivered by the toroids 68, 70, 72 are transmitted by conductors 74 (three time two wires) to a microprocessor-based processing device 76. A power supply unit 78 of the processing device 76 receives its power from the current transformers 68, 70, 72 via a connection 80 (six-wire). The output of the processing device 76 is connected by an opto-electronic serial connection 82 to the input 46 of the microprocessor of the module 16. This module 16 transmits the data corresponding to the currents flowing in the phases R,S,V via the two-wire network 10, 12 to the other modules connected to the two-wire network.

The signal processing power is thus drawn from the three-phase mains R,S,V, whereas the data transmission module 16 is supplied by the two-wire network 10, 12, in the manner described above. The opto-electronic connection 82 isolates the measurement part associated with the three-phase mains R,S,V from the transmission part connected to the two-wire network 10, 12. Data transmission operates even in the event of a mains R,S,V failure. The system-powered supply of the measuring device does not complicate the installation and enables a saving to be made on the power transmitted by the two-wire network 10, 12. A sensor of the type illustrated by FIG. 5 can remote control an actuator, for example a protective contactor of a motor supplied by the three-phase mains R,S,V. The measurements and/or orders are transmitted by the two-wire network 10, 12 which constitutes the connection between the sensor and the actuator.

The modules 14, 16, 18 are preferably of a standard type, individualization being achieved at the controller level, more particularly when a module is assigned to a certain function. Each module is programmed to perform the function which is assigned to it, and it is given a certain autonomy. The central unit 15 of the management controller includes additional functions, for example data display or centralization to control the whole installation. The power supply unit 19 can of course be separated from the central unit 15, or certain functions of the central unit can be dissociated from the latter, for example the display device. The connection via a two-wire network 10, 12 is particularly flexible and enables the modules to be located in any manner in the building.

Figure 7:
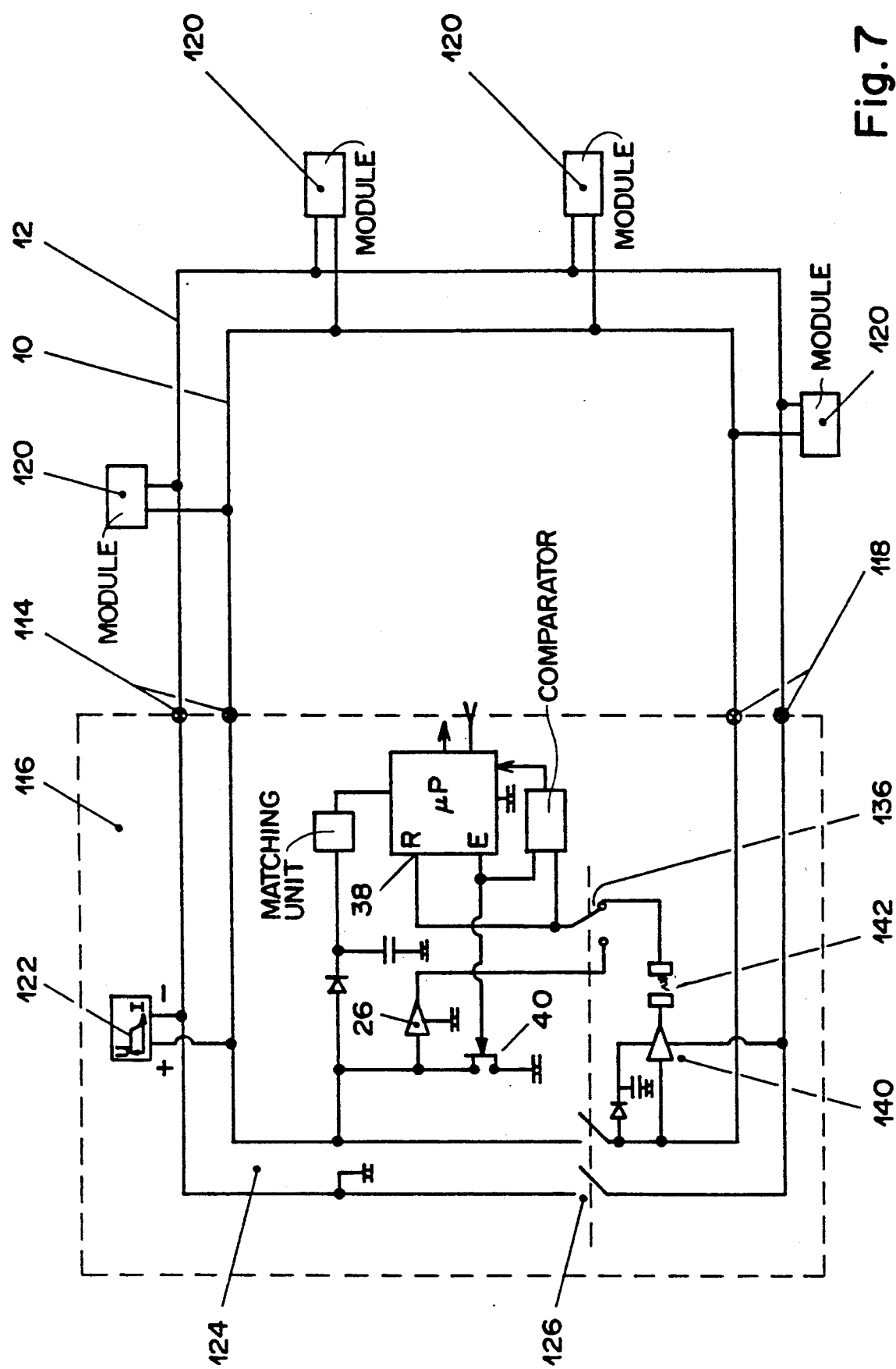
FIG. 7 shows the block diagram of a building technical management controller, equipped with a line break detection device.

In FIG. 7, the line 10, 12 is connected on the output side to a pair of terminals 114 of a central unit 116 The opposite ends of the two-wire line 10, 12 are connected to a second pair of input terminals 118 of the central unit 116. Modules 120 of the same type as the module 16 described in reference to FIG. 1 are located along the two-wire line 10, 12. The different modules 120 are supplied with power by power supply unit 122 belonging to the central unit 116. The two pairs of terminals 114, 118 are connected in the central unit 116 by a loop 124, in which a switch 126, preferably electronic, is inserted enabling the connection to be interrupted. In the closed position of the switch 126, the power supply unit 122 supplies the two-wire line 10, 12 by its two ends, which enables the apparent electrical resistance of the line to be reduced. The central unit comprises a transceiver device, of the same type as the module 16 in FIG. 1, parallel connected to the power supply unit 122, and capable of transmitting and receiving the messages transmitted on the two-wire line 10, 12.

The comparator unit input connected to the receiver port 38 (R) of the microprocessor is connected to a change-over switch 136, securedly united to the switch 126 and opening with the latter to interrupt transmission to the comparator and to the microprocessor of the signals received by the amplifier 24 during the interrupt detection phase, corresponding to opening of switch 126, and to be connected to a receiver 140. The receiver 140 is connected to the input terminals 118 and the signals received are transmitted by an opto-electronic connection 142 to the change-over switch 136.

The break detection device operates as follows:

In normal operation switch 126 is closed, and the contact 136 connects the amplifier 26 to the receiver port "R". The controller operates normally, the power supplied by the unit 122 and the signals sent by the central unit being transmitted by both the output and the input of the two-wire line. This power supply and transmission by the two ends does not modify operation, but on the contrary enables the losses in the two-wire line to be reduced At regular intervals, the microprocessor of the central unit 116 runs a line break detection procedure, by opening the switch 126 and sending a control message, by opening and closing of the transmission switch 40. At the same time as the switch 126 isolating the input terminals 118 from the output terminals 114 opens, the changeover switch 136 changes position to switch receipt from the receiver 140 to the receiver port 38 of the microprocessor. Transmission of these signals is performed by the optoelectronic connection 142 to the microprocessor receiver port and to the comparator unit, which checks the agreement between the signals sent on the output terminals 114, and the signals received on the input terminals 118. Non-receipt of the signals on the input terminals 118 corresponds to an interruption or a break in the line, i.e. of one of the two wires 10, 12. When the signals agree, the continuity of the line is confirmed and the device reverts to the original normal operating position. The control procedure is relatively short and can be run during normal operation of the controller which is not disturbed. The frequency of control obviously depends on the quality of the control, and on the risks of mains or two-wire line 10, 12 breaks.

When a break in the two-wire line 10, 12 is detected, it may be useful to locate the fault and according to a development of the invention, this location is achieved by means of messages sent by the central unit 116 to the different modules 120. The latter are requested for information and must answer, and the question and answer order preferably corresponds to the staggering of the modules 120 along the two-wire line 10, 12. No answer corresponds to non-receipt of the message, i.e. to a line break upstream from the module which didn't answer. This questioning procedure can be run when the switch 126 is open, to avoid any interference between the signals transmitted on the input and on the output of the central unit 116.

The two-wire line break detection procedure and device are particularly simple and well-suited to a building technical management controller, the structure of which is practically unmodified.

Figure 8:
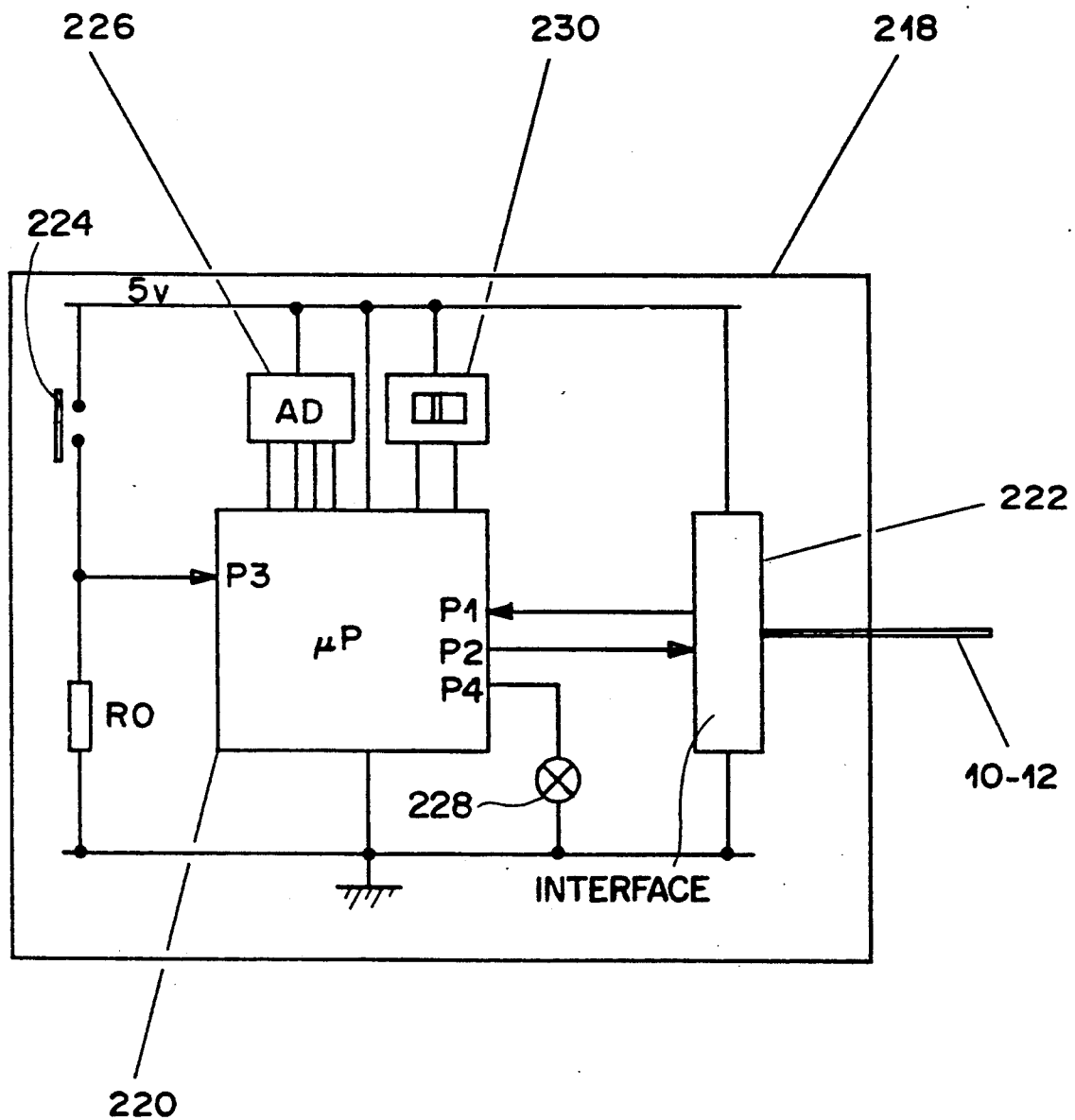
FIG. 8 illustrates a particular embodiment of a push-button module.

FIG. 8 represents in greater detail a control device constituted by a push-button module 218 The module 218 is connected to the network 10, 12 and designed to control an associated actuator (not shown), itself connected to the network. This actuator can be controlled by the central unit 15 and by several associated control devices, including the push-button module 218.

The module 218 can, for example, be used to control a lamp or a household appliance located in another room of the building controlled by the controller. According to a development of the invention, a status indication of the associated actuator is provided on the module 218.

The push-button module 218 comprises a microprocessor 220 an input gate P1 and an output gate P2 of which are connected by an interface 222 to the network. The module 218 can thus send messages, which are transmitted by the network to the associated actuator, and monitor all the messages transmitted by the network.

A microprocessor control input gate P3 is normally grounded via a resistor R0. A push-button 224 enables this input P3 to be connected temporarily to the module supply voltage (5 V). Closing of the push-button 224 results in a message, or control order, being sent by the microprocessor 220 to the actuator associated with the module.

An address can be assigned to the module 218 by means of an addressing system 226, for example constituted by a thumb-wheel. In the embodiment represented, the addressing system, which enables its four outputs to be connected selectively to the supply voltage, supplies the microprocessor with a coded address on 4 bits. In a preferred embodiment, the same address is assigned to an actuator and to the various control devices associated therewith.

The message sent by the module 218 when the push-button 224 is actuated contains this address, thus indicating to the microprocessor of the associated actuator that this message is addressed to it.

An indicator lamp 228, which can be constituted by a light-emitting diode, is connected between an output P4 of the microprocessor and the ground. This indicator lamp is designed to indicate the status of the actuator associated with the module 218. The microprocessor 220 of the module 218 permanently monitors the messages transmitted over the network. It detects, by means of their address, all the messages intended for the associated actuator and, thus knowing the successive orders, for example on, off or status change, which are addressed to the actuator, it deduces therefrom the status of the latter and controls its output P4 so that the indicator lamp 228 gives an indication of the actuator status. As an example, the indicator lamp 228 may light up, the microprocessor output P4 being switched to the supply voltage, to indicate the On status of the actuator, and go out, the output P4 being grounded, to indicate that the actuator is Off.

According to another embodiment, not represented, the indicator is constituted by a two-colored light-emitting diode, for example green and red, controlled by the microprocessor in such a way as to flash green when the associated actuator is On and red when the actuator is Off.

In the embodiment represented, the push-button module 218 comprises a selector switch 230 enabling the operating mode of the module to be selected.

The latter can, in fact, each time the push-button 224 is actuated, send the associated actuator either a switch-on order, or a switch-off order, or a status change order via the network. The operating mode selected can be preprogrammed in the microprocessor. However, in the preferred embodiment, the required operating mode can be selected manually by an operator by means of the selector switch 230. In the figure, the three-position selector switch 230 comprises two outputs connected to the microprocessor, these two outputs being able to be connected selectively to the supply voltage. In a first position of the selector switch, neither of the outputs is connected to the supply voltage. In the second position of the selector switch, a first output is connected to the supply voltage, whereas in the third position, only the second output is connected to the supply voltage. Each of the positions corresponds to one of the three operating modes described previously.

Figure 9:
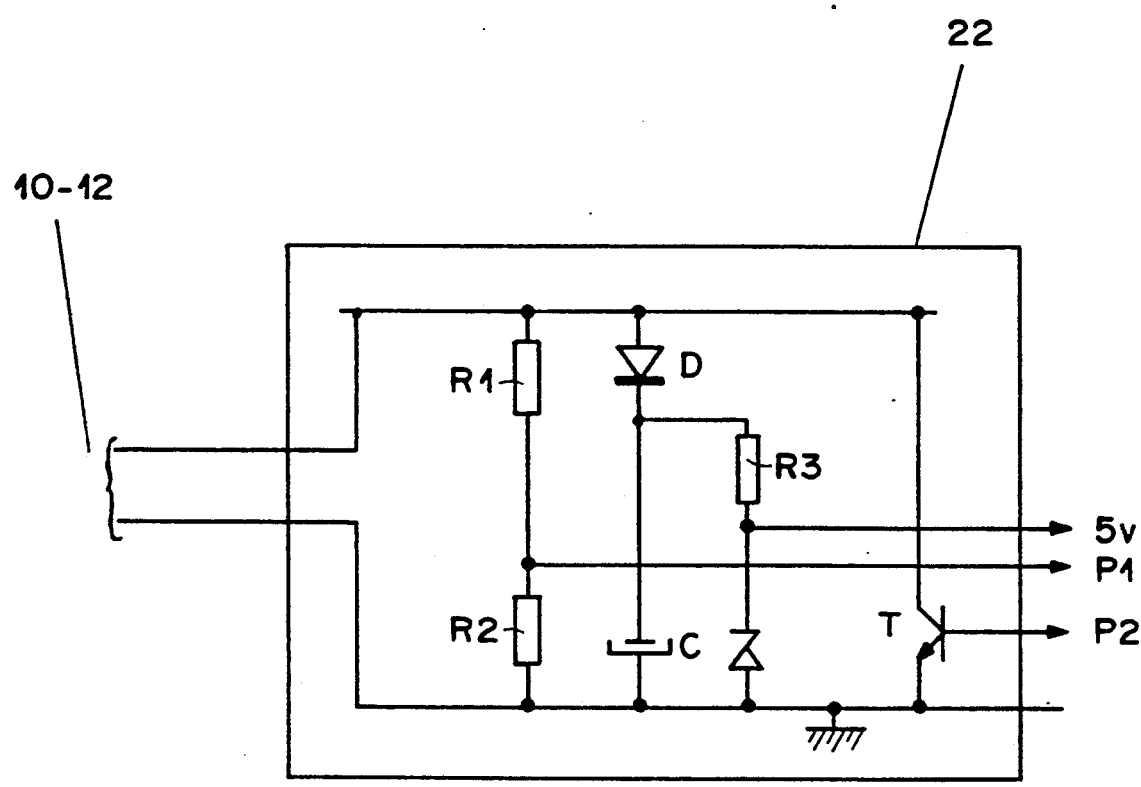
FIG. 9 represents a particular embodiment of an interface of a module according to FIG. 8.

FIG. 9 illustrates a particular embodiment of an interface 222.

A voltage divider, formed by two resistors R1 and R2 connected in series between the two wires of the network, enables the messages transmitted over the network to be monitored, the common point of the resistors being connected to the microprocessor input P1. A transistor T, whose emitter-collector junction is mounted between the two wires of the network, and whose base is connected to the microprocessor output P2, provides the output interface between the microprocessor and the network. A message sent by the microprocessor in the form of successive pulses applied to the transistor base causes a succession of short-circuitings of the network wires. The network also supplies the module power supply: a diode D is connected in series with a capacitor C between the network wires, the capacitor being parallel connected to a resistor R3 and a series-connected Zener diode. The module supply voltage is then available at the Zener diode terminals.

Status indication of an actuated actuator is not limited to a push-button module, but can be applied to any microprocessor-based control device designed to control an actuator via a data transmission network. The control order can be supplied manually to the control device, by a push-button, a switch or any other mechanical means fitted in the control device, automatically by comparison of a measured quantity with a threshold, or by programming. To give an example, an automatic control device can be formed by a temperature sensor comprising a temperature probe whose measurement signals are applied to the control input P3 of the microprocessor. The latter compares the amplitude of these signals with at least one predetermined threshold and sends on or off orders to an actuator designed to open or close a heating valve.

The examples described above only refer to control orders of the all-or-nothing type, causing the associated actuator to be switched on or off. The same principle can also be applied to control devices and to an associated actuator operating in analog mode or with several operating thresholds. In this case an analog signal scaling circuit and an analog-to-digital converter or comparators are added. To give an example, a temperature sensor can compare the temperature signals it receives with several thresholds separated by preset intervals and send appropriate orders for control of the associated actuator, for example closing, full opening, 60% opening, 50% opening, etc. . . . In this case, the indicator must be adapted to allow differentiated indication of the actuator status. The number and location of the lighted devices can be adapted according to requirements. An indicator lamp can enable two statuses to be indicated, off or on, without differentiating the statuses corresponding to reduced rate operation. It can also enable three statuses to be indicated, reduced rate operation being indicated by flashing of the indicator lamp. A number of indicator lamps can be provided which corresponds to the number of different statuses the actuator can take, so as to indicate the different actuator statuses accurately at control device level.

In the embodiment described, the actuator and the associated control devices have the same address, which makes it easy for the various control devices to recognize the messages intended for the associated actuator However, each control device and each actuator can be assigned a different address. In this case, each control device has to be programmed so as to know the address of the associated actuator All the messages sent to the actuator contain its address, the destination address, and the control devices are programmed to detect, by means of this destination address, all the messages intended for the actuator wherever they come from, and can consequently determine the actuator status.

In the embodiments hitherto described, the actuator status is determined from analysis of the orders which are sent to it and which are transmitted via the network. The indicator therefore indicates the status the actuator normally should have, or the required status. This status can, in the event of failure of the actuator for example, be different from the actual actuator status. To obtain an indication of the actual actuator status, a response message, sent by the actuator in reply to a control order and indicating whether the order has been taken into account or not, can be included The microprocessors of the control devices associated with the actuator then take these response messages into account to determine the actual status of the actuator which is indicated in the control devices.

We claim:

1. An integrated power and data transmission apparatus for controlling the operation of electrical equipment in a building comprising:
   a two-wire bus including a first line acting as a voltage supply line and a second line acting as a return line for power and asynchronous data transmission;
   a power supply means for providing a low level DC voltage to said two-wire bus, said power supply means including a current limiter for limiting the current supplied by said power supply means to said two-wire bus when said supply line and said return line are short-circuited;
   a plurality of independently addressable modules coupled to said two-wire bus and powered by said power supply means, said plurality of modules including at least one module which transmits a command signal and one module which performs a preprogrammed function in response to said command signal, wherein each of said plurality of modules includes:
   a) data transmission and data reception means for performing data transmission and data reception with another module;
   b) a programmable microcontroller for controlling the operation of the module including performance of said preprogrammed function and said data transmission and data reception;
   c) interface means coupled to said two-wire bus including means for providing uninterrupted power to the module and short-circuiting means controlled by said programmable microcontroller for short-circuiting said supply line to said return line; and
   d) data communication priority means for determining a priority of data communication for the module including mans for detecting when a difference occurs between a signal present on said two-wire bus with a data transmission signal output from the module and withdrawing from data transmission when said difference is detected;
   wherein data is transmitted on said two-wire bus as a binary DC signal with a logic high represented by the presence of a supply voltage of the two-wire bus and a logic low represented by a zero voltage on the two-wire bus caused by the short-circuiting of said supply line with said return line.

2. The apparatus of claim 1, wherein at least one of said modules is connected to a supplemental electrical device including at least one of a sensor and an actuator, wherein said supplemental electrical device is electrically connected to the microcontroller of said module so that said microcontroller can electrically communicate with said supplemental electrical device.

3. The apparatus of claim 1, further comprises:
   a self diagnostic unit including a power supply, switch means and control module consisting of one of said plurality of modules for testing said apparatus;
   a first and second end of said two-wire bus being arranged so that said plurality of modules, excluding said control module, are connected to said two-wire bus between said first and second ends;

internal conductor means located within said diagnostic unit for forming a continuous electrical loop between said first and second ends of said two-wire bus;

wherein said switch means simultaneously switches open a normally closed segment of said internal conductor means to create a break in said continuous electrical loop and creates an electrical connection from said second end through a supplemental receiving means to said control module;

wherein said diagnostic unit is capable of operating under at least two conditions, a normal condition when said segment is closed and there is no electrical continuity from said second end through said supplemental receiving means to said control module, and a break condition where said segment is open and said electrical continuity exists, thereby permitting a signal transmitted by said said control module to said first end to propagate through said two-wire bus to said second end and then through said supplemental receiving means to said control module;

wherein said supplemental receiving means includes a comparator for comparing signals transmitted at said first end with those received at said second end to determine if a break exists along said two-wire bus.

4. The apparatus of claim 3, wherein said diagnostic unit further comprises:

means for transmitting a signal requesting a response to at least two of said plurality of modules connected to said two-wire bus; and means for determining if a break in said two-wire bus has occurred between said two modules based on whether a response was received from said two modules.

5. The apparatus of claim 1, wherein at least one of said modules has an associated actuator and actuator status indication means for indicating the status of said actuator.

6. The apparatus of claim 5, wherein a single address is assigned to said module and to its associated actuated module.

7. The apparatus of claim 5, wherein said actuator status indication means comprises a light-emitting diode.

8. The apparatus of claim 5, wherein microcontroller of at least one of said modules has an external control input port connected to a voltage source by means of a push-button, depression of said push-button causing a control message to be sent by said microcontroller to actuate said actuator.

9. The apparatus of claim 8, wherein said external control input port is connected to a measurement sensor, said microcontroller comparing a measurement sensor output signal with preset thresholds and generating actuator control signals based on said comparison.

* * * * *